United States Patent [19]

Schulz et al.

[11] Patent Number: 6,060,911
[45] Date of Patent: May 9, 2000

[54] CIRCUIT ARRANGEMENT WITH AT LEAST FOUR TRANSISTORS, AND METHOD FOR THE MANUFACTURE THEREOF

[75] Inventors: Thomas Schulz; Thomas Aeugle; Wolfgang Roesner, all of Munich; Lothar Risch, Neubiberg, all of Germany

[73] Assignee: Siemens Aktiengesellschaft, Munich, Germany

[21] Appl. No.: 09/138,160

[22] Filed: Aug. 21, 1998

[30] Foreign Application Priority Data

Aug. 22, 1997 [DE] Germany ............... 197 36 672

[51] Int. Cl.[7] .................. H03K 19/094; H01L 29/76
[52] U.S. Cl. .................. 326/119; 326/119; 326/121; 326/101; 326/102; 326/103; 257/329; 257/369
[58] Field of Search ................ 326/119, 101, 326/102, 103, 121; 257/329, 330, 331, 332, 369

[56] References Cited

U.S. PATENT DOCUMENTS

| 4,951,102 | 8/1990 | Beitman et al. ............ 357/23.4 |
| 5,252,849 | 10/1993 | Fitch et al. ............... 257/329 |
| 5,324,673 | 6/1994 | Fitch et al. ............... 437/40 |
| 5,414,288 | 5/1995 | Fitch et al. ............... 257/328 |
| 5,414,289 | 5/1995 | Fitch et al. ............... 257/329 |
| 5,872,374 | 2/1999 | Tang et al. ............... 257/328 |
| 5,923,185 | 7/1999 | Zhou ...................... 326/50 |

FOREIGN PATENT DOCUMENTS

| 0700 093 A1 | 3/1996 | European Pat. Off. |
| 38 38 355 A1 | 5/1990 | Germany |
| 41 39 039 A1 | 6/1992 | Germany |
| 43 41 667 C1 | 12/1994 | Germany |

OTHER PUBLICATIONS

L. Risch et al, Vertical MOS–Transistors with 70nm Channel Length, ESSDERC, (1995), pp. 101–104.

K. Hoffmann, VLSI–Entwurf, Modelle und Schaltungen, Oldenburg (1990), p. 365.

T. Mizuno et al, IEDM Technical Dig., (1996), Experimental Study of Carrier Velocity Overshoot in Sub–0.1 $\mu$m Devices, pp. 109–112.

IEEE Transactions on Electron Devices, vol. 38, No. 3, Mar. 1991, H. Takato et al, Impact of Surround Gate Transistor (SGT) for Ultra–High–Density LSI's, pp. 573–578.

Primary Examiner—Michael Tokar
Assistant Examiner—Vibol Tan
Attorney, Agent, or Firm—Hill & Simpson

[57] ABSTRACT

In the circuit arrangement two of the four vertical transistors are complementary to the remaining two transistors. Two of the transistors are respectively arranged at the same level. For this purpose, layer structures (St1, St2, St3, St4) are structured that respectively have at least a channel layer and a source/drain region of one of the transistors. All the layer structures (St1, St2, St3, St4) can be produced from a layer sequence with only four layers. In order to avoid leakage currents due to a parasitic bipolar transistor, the layer structures (St1, St2, St3, St4) can be realized very thinly, using spacer-type masks. Electrical connections between parts of the four transistors can take place via layers of the layer sequence. The contacting to the output voltage terminal can take place via a step that is formed by two layers of the layer sequence.

15 Claims, 8 Drawing Sheets

CIRCUIT ARRANGEMENT WITH AT LEAST FOUR TRANSISTORS, AND METHOD FOR THE MANUFACTURE THEREOF

BACKGROUND OF THE INVENTION

The present invention relates to a circuit arrangement with at least four transistors. Two of the four transistors are complementary to the remaining two transistors. The four transistors are suited in particular for use as a NAND gate.

In the development of new integrated circuit arrangements, there is a need for increased packing density. The realization currently takes place mostly in a planar silicon technology.

NAND gates are frequently-used logical elements of circuit arrangements. If at least one of two input voltage terminals of a NAND gate supplies a signal in the form of a voltage, a signal is likewise obtained at the output voltage terminal of the NAND gate. In K. Hoffmann, VLSI-Entwurf, Modelle und Schaltungen, Oldenburg 1990, page 365, a typical layout of a NAND gate is disclosed.

Smaller structural sizes in planar technology can be achieved if the optical lithography is replaced by electron beam lithography, whose resolution capacity is essentially better; see e.g. T. Mizuno, R. Ohaba, IEDM Techn. Dig., page 109, 1996. Since, however, electron beam lithography is slow, it does not appear suitable for use in semiconductor manufacturing, for economic reasons.

For the reduction of the surface of an MOS transistor, vertical transistors are examined. Since the channel length runs vertically in relation to a surface of a substrate, the surface of a vertical transistor can be smaller than the conventional planar transistors. A further reduction of the surface is obtained by reducing the channel width required for a particular current strength, in that the channel length is shortened. In L. Risch, W. H. Krautschneider, F. Hofmann, Vertical MOS-Transistor with 70 nm Channel Length, ESS-DERC 1995, pages 101 to 104, vertical MOS transistors are described. For their manufacture, doped layers of alternating conductivity types are fashioned in the form of a layer sequence corresponding to source, channel, and drain, surrounded annularly by the gate dielectric and gate electrode.

SUMMARY OF THE INVENTION

In the German patent DE 43 41 667 C1, a NAND gate is disclosed in which two vertical MOS transistors connected in parallel are realized in a common layer sequence, and layer sequences of two vertical MOS transistors connected in series are arranged one over the other.

It is an object of the present invention to provide a circuit arrangement with at least four transistors that can be manufactured with improved circuit characteristics. In addition, a method for the manufacture of such a circuit arrangement is indicated.

In an inventive circuit arrangement, the four transistors are vertical MOS transistors. A first transistor and a fourth transistor are complementary to a second transistor and to a third transistor. The first transistor and the fourth transistor are in series, and are connected between a first voltage terminal and an output voltage terminal. The second transistor and the third transistor are connected in parallel and are connected between the output voltage terminal and a second voltage terminal. A gate electrode of the third transistor and a gate electrode of the fourth transistor are connected with a first input voltage terminal. A gate electrode of the first transistor and a gate electrode of the second transistor are connected with a second input voltage terminal. Layer structures are provided that have channel layers of the transistors and at least one source/drain region of each transistor. The layer structures have edges that are adjacent to the channel layers and that are provided, at least in the region of the channel layers, with a gate dielectric adjacent to the gate electrodes of the transistors. The channel layer of the first transistor and the channel layer of the fourth transistor are located at the same height. The channel layer of the second transistor and the channel layer of the third transistor are located at the same heights. The channel layer of the first transistor and the channel layer of the second transistor are located at different levels.

The circuit arrangement can be produced from a single layer sequence with only four layers. In this case, one of the layers, comprising the channel layers of the first and of the fourth transistor, and one of the layers, comprising the channel layers of the second and of the third transistor, are adjacent to one another. A small number of layers offers the advantage that doping profiles of the layers bleed less.

It is advantageous if on both sides, i.e. at least on two opposite edges of the layer structure, the layer structures are provided with the gate dielectric and the gate electrode. In contrast to a one-sided arrangement, in the two-sided arrangement the channel width of the vertical MOS transistors is doubled, without an enlargement due thereto of the surface of the vertical MOS transistors, and the current is thus increased, and the formation of space charge regions between the two edges in the channel layer is enlarged. This is advantageous because in space charge regions no leakage currents arise due to a parasitic bipolar transistor. For this reason, it is also advantageous if a space charge region forms within the overall channel layer.

In order to increase the packing density, it is advantageous to reduce the channel width of a transistor necessary for a particular current strength, by shortening the channel length of the transistor. For the vertical MOS transistor, a short channel length can easily be realized, since the channel length is determined by the thickness of the channel layer, and thus not by the minimal structural size that can be manufactured in the respective technology. In order to avoid leakage currents due to punch-through given a short channel length, the channel layer should be highly doped.

Since space charge regions become smaller the higher the doping material concentration of the channel layer is, in order to obtain a space charge region within the overall channel layer given a short channel length, a dimension between two opposed edges of the layer structure must become particularly small. For this purpose, the layer structure is produced using a spacer that serves as a mask. The dimension between the two opposed edges of the layer structure becomes so small that, given a corresponding controlling of the gate electrode, the vertical MOS transistor depletes completely. At a standard voltage of 0V–2V, the dimension is thus approx. 30 nm–90 nm.

The layer sequence can be produced on a surface of a substrate over the whole surface by means of epitaxial growth of in situ doped semiconductor material. A recess can also be produced in the substrate, in which recess the layer sequence is produced by means of epitaxial growth. A material can also be deposited on the surface, in which material a recess is produced that extends up to the surface and in which the layer sequence is produced by means of epitaxial growth. Given epitaxial growth of the layer sequence in the recess, facets form on edges of the recess, since on these edges the growth rate is lower in selective epitaxy. By this means, the layers become particularly thin, leading to a particularly small channel length. Layers of the layer sequence can also be produced by means of implantation with respectively differently charged ions and different ranges. For these layers, epitaxial growth is not necessary, and the substrate is structured for the layer structure. The layer sequence can contain a silicon layer and/or an $Si_{(1-x)}Ge_x$ layer.

Since the first transistor and the fourth transistor are not complementary to one another, the first transistor and the fourth transistor can be manufactured in the same method steps, which is a simplification of the process. The same holds analogously for the second transistor and the third transistor.

For the production of the layer sequence, at least four layers, doped with for example alternating conductivity types, are produced. If the layer sequence consists of more than four layers, the conductivity types of adjacent layers need not be opposed. Transistors complementary to one another are formed at different levels in relation to an axis that runs perpendicular to the surface of the substrate. This means that both channel layers and also source/drain regions arise from at least two of the four layers.

It is also possible to form more than four layers.

If the layer structure is produced using a spacer as a mask, an edge is formed, along which the spacer arises by means of depositing and etching back of material. The edge can be produced by means of deposition and structuring of a first auxiliary layer above the layer sequence. The edge can also arise by means of masked etching of the layer sequence.

Layer structures of vertical MOS transistors complementary to one another are formed by applying a first mask on the layer sequence, and subsequently deep-etching the mask at least two layer thicknesses. By this means, there arises a layer structure and a provisional layer structure. The first mask is then removed. The layer structure is subsequently covered with a second mask. Deep etching of one layer thickness then takes place, whereby a layer structure arises that lies one layer thickness deeper than the covered layer structure.

As an alternative, first a region in which one of the layer structures is to be produced can be covered by the second mask, and subsequently silicon can be etched one layer thickness deep. The second mask is removed. Subsequently, the first mask is applied for the production of the layer structures. With the first mask, deep-etching of at least two layer thicknesses takes place, by which means a layer structure arises in the previously covered region that is located one layer thickness higher than a layer structure that arises in the non-covered region.

As an alternative, a primary first mask can be produced for the formation of a first layer structure. The primary first mask is covered by a second mask. Subsequently, deep-etching of one layer thickness takes place. In a region not covered by the second mask, a secondary first mask for a second layer structure is subsequently fashioned. The second mask is fashioned from a material different from the first masks, and is removed after production of the second mask. Subsequently, deep-etching of at least two layer thicknesses takes place, whereby the layer structures arise.

For these methods, essentially identical layer thicknesses of the layers are required.

The first mask consists e.g. of four parts separated from one another. In order to increase the packing density, as well as to simplify the process, electrical connections can be realized in that the four layer structures are partially or entirely contiguous. If layer structures are entirely contiguous, the first mask has fewer than four parts. If the contiguity of layer structures is not desired, then, given a first mask with fewer than four parts, the layer structures can be separated from one another at a later time.

It is advantageous if a first source/drain region of the second transistor and a first source/drain region of the third transistor, which are connected with the second voltage terminal, are arranged above the associated channel layers. By this means, the layer from which a second source/drain region of the second transistor and a second source/drain region of the third transistor arise can serve as an electrical connection between these source/drain regions. For the connection of the first source/drain regions of the second transistor and of the third transistor, a conductive structure is produced. Instead of this, the first source/drain region of the second transistor and the first source/drain region of the third transistor can be arranged underneath the associated channel layers.

It is advantageous to lengthen the second source/drain region of the third transistor and a second source/drain region of the fourth transistor, which are connected with the output voltage terminal, beyond the transistors and to form a step. For this purpose, the layer from which the second source/drain region of the fourth transistor arises is adjacent to the layer from which the second source/drain region of the third transistor arises. A contact of the output voltage terminal is arranged on this step. The process outlay is reduced, since no additional lines are required for the connection of the second source/drain regions of the second transistor, of the third transistor, and of the fourth transistor. In order in this case to connect a first source/drain region of the fourth transistor with the second source/drain region of the first transistor via a conductive structure with identically deep contacts, the second source/drain region of the first transistor is fashioned above the channel layer of the first transistor. A contact of the first voltage terminal is fashioned on the layer from which the first source/drain region of the first transistor arises.

If the second source/drain regions of the second transistor, of the third transistor and of the fourth transistor are connected with one another in another way, e.g. via a conductive structure, the first source/drain region of the fourth transistor can be arranged underneath the channel layer of the fourth transistor, and the second source/drain layer of the first transistor can be arranged underneath the channel layer of the first transistor. The connection between the first source/drain region of the fourth transistor and the second source/drain region of the first transistor then takes place via the layer from which they have arisen.

In order to realize conductive structures in only one plane parallel to the surface, it is advantageous to arrange the four transistors in such a way that a line of connection that connects the first transistor with the second transistor, the second transistor with the third transistor, the third transistor with the fourth transistor, and the fourth transistor with the first transistor is essentially tetragonal. In this case, the contact of the first input voltage terminal can be arranged between the third transistor and the fourth transistor, and a contact of the second input voltage terminal can be arranged between the first transistor and the second transistor. Other arrangements, e.g. along a line, are likewise conceivable.

It is advantageous to fashion the gate electrodes as spacers, because in this way the gate electrodes become small and can be produced in self-adjusted fashion. For this purpose, conductive material is deposited and subsequently etched until the gate electrodes arise as spacers. In order to produce contact surfaces for the contact of the first input voltage terminal and for the contact of the second input voltage terminal, it is advantageous to produce the layer structure of the first transistor and the layer structure of the second transistor or, respectively, the layer structure of the third transistor and the layer structure of the fourth transistor at a small distance from one another. In the etching of the conductive material, a mask is used that overlaps somewhat the first layer structure and the second layer structure or, respectively, the third layer structure and the fourth layer structure. The conductive material under this mask forms the contact surfaces. In addition, it connects the gate electrodes of the third transistor and of the fourth transistor or, respectively, the gate electrodes of the first transistor and of the second transistor with one another.

The four transistors of the circuit arrangement are particularly suited for use as a NAND gate. Since further terminals are possible on other elements of the circuit arrangement, the four transistors do not necessarily have to form a NAND gate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
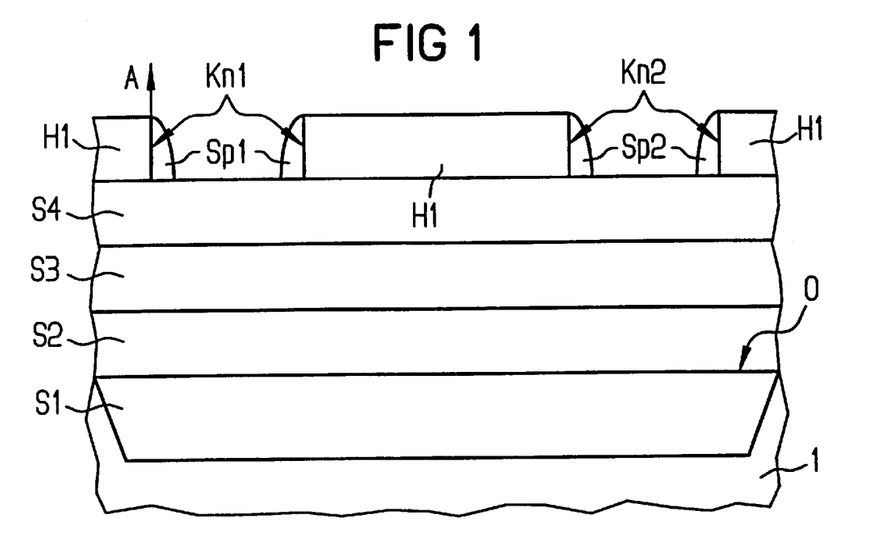
FIG. 1 shows a first substrate after production of a first doped layer using a mask and epitaxial growth of a second, third and fourth layers, application and structuring of a first auxiliary layer, and production of first spacers and second spacers on first edges and second edges of the auxiliary layer.
Figure 8:
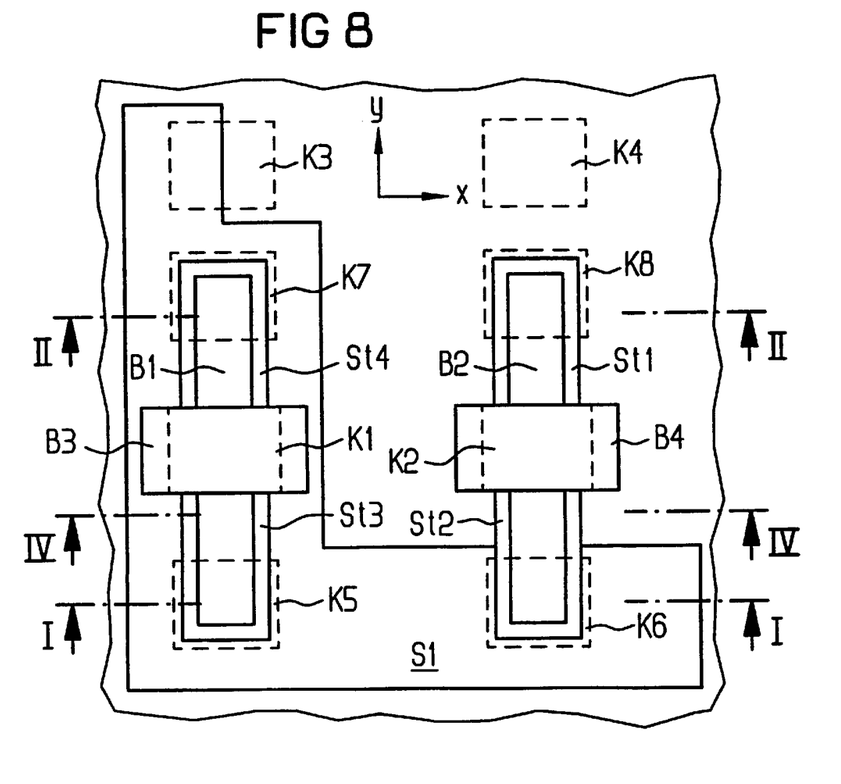
FIG. 8 shows a segment from a view of the substrate, in which are shown the first layer structure, the second layer structure, the third layer structure, the fourth layer structure, the first region, the second region, the third region, the fourth region, the first layer, the first contact, the second contact, the third contact, the fourth contact, the fifth contact, the sixth contact, the seventh contact, the eighth contact, the x-axis and the y-axis.

In a first embodiment, using a first photoresist mask (not shown) that does not cover an I-shaped region with an additional dead-end feeder, by means of implantation a p-doped first layer S1, approx. 300 nm thick, is produced in a substrate 1 made of silicon. The doping material concentration of the first layer is approx. $10^{21}$ cm$^{-3}$. Subsequently, an n-doped second layer S2, a p-doped third layer S3 and an n-doped fourth layer S4 are produced on a surface O of the substrate 1 by means of epitaxial growth. The doping material concentrations of the second layer S2, of the third layer S3 and of the fourth layer S4 are each approx. $10^{18}$ cm$^{-3}$. The second layer S2, the third layer S3 and the fourth layer S4 are each approx. 200 nm thick. Subsequently, the doping material concentration of the fourth layer S4 is increased to $10^{21}$ cm$^{-3}$ by means of implantation. By means of deposition of SiO$_2$ in a thickness of approx. 200 nm, a first auxiliary layer H1 is produced. Using a second photoresist mask (not shown), which does not cover a first oblong rectangular region B1 and an oblong rectangular second region B2 running parallel thereto, SiO$_2$ is etched until the fourth layer S4 is partially exposed. By this means, on the borders of the first region B1 there arises a first edge Kn1, and second edges Kn2 arise on the borders of the second region B2. The first region B1 and the second region B2 are respectively approx. 400 nm wide in relation to an x-axis x running parallel to the surface O, and 2400 nm long in relation to a y-axis y that runs parallel to the surface O and perpendicular to the x-axis x. A connection line between a midpoint of the first region B1 and a midpoint of the second region B2 runs parallel to the x-axis (see FIG. 8). By means of deposition and back-etching of silicon nitride, first spacers Sp1 are produced on the first edge Kn1, and second spacers Sp2 are produced on the second edge Kn2 (see FIG. 1).

Figure 2:
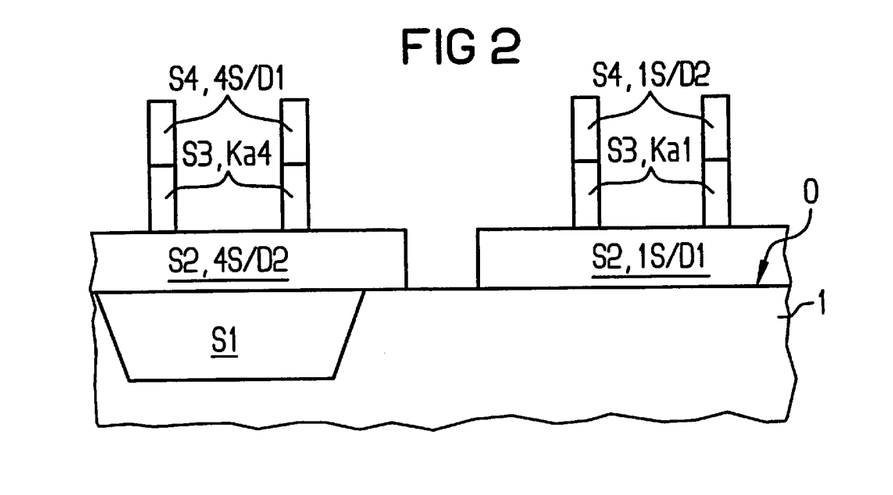
FIG. 2 shows a cross-section, parallel to the cross-section of FIG. 1, through the substrate, after removal of the first auxiliary layer and production of a first layer structure, a second layer structure (not shown in this figure), a third layer structure (not shown in this figure), and a fourth layer structure.
Figure 3:
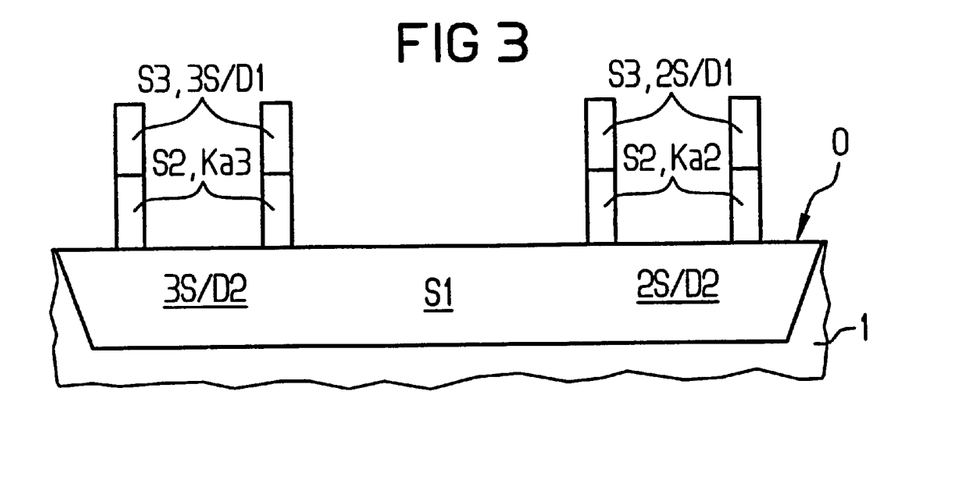
FIG. 3 shows the cross-section of FIG. 1 after the process steps of FIG. 2.
Figure 9:
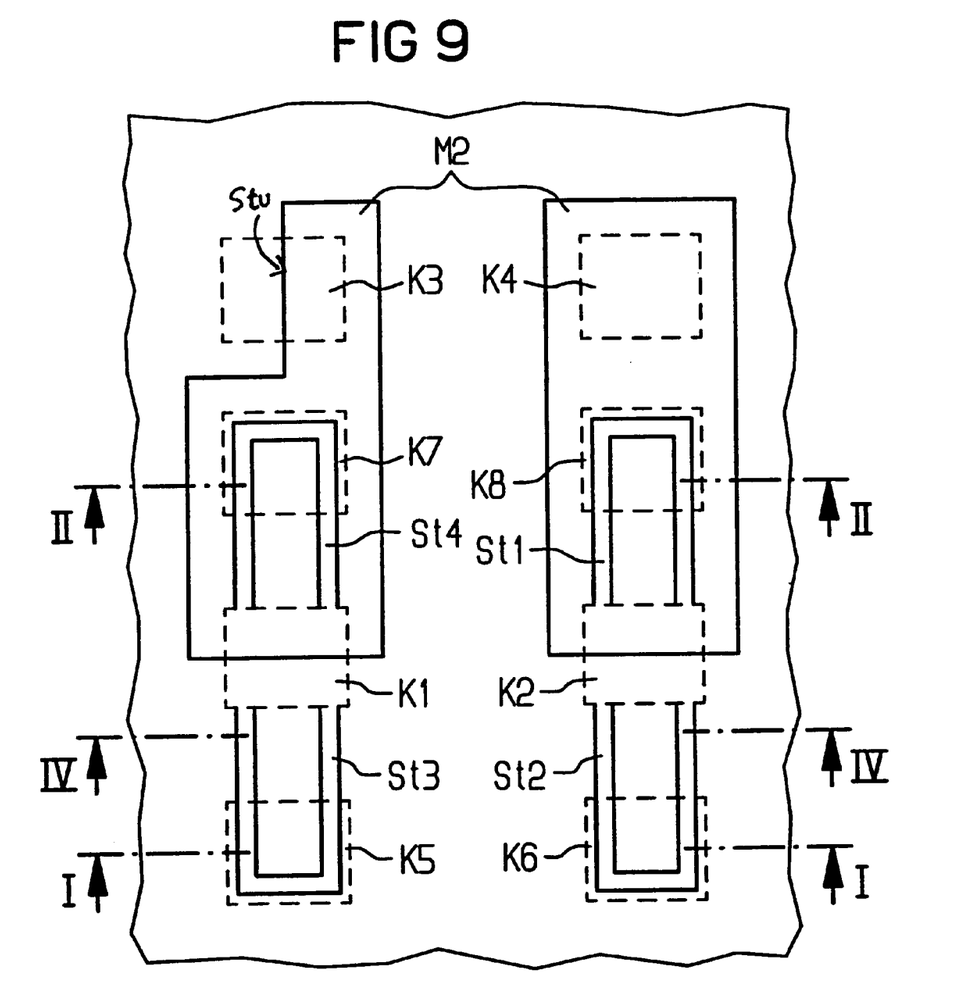
FIG. 9 shows a top view of the substrate, in which are shown the layer structures, the contacts, and the second mask.

Subsequently, the structured first auxiliary layer H1 is removed by means of etching with, for example, NH$_4$F/HF. In order to obtain four layer structures separated from one another, the first spacer Sp1 and the second spacer Sp2 are partially removed using a third photoresist mask (not shown) that does not cover a rectangular third region B3 transversely overlapping the first region B1 and does not cover a rectangular fourth region B4 transversely overlapping the second region B2. The structured first spacer Sp1 and the structured second spacer Sp2 together form a first mask. By means of the etching of silicon selectively to silicon nitride, with for example HBr/NF$_3$/He/O$_2$, parts of the fourth layer S4 and of the third layer S3 are subsequently removed. By this means there arises a first layer structure St1, a provisional second layer structure, a provisional third layer structure and a fourth layer structure St4. Subsequently, a second mask M2, which overlaps one half of the first region B1 and one half of the second region B2, is produced by depositing $SiO_2$ and structuring it using a photolithographic method. Using e.g. $Cl_2$/$CHF_3$ as an etching agent, silicon is etched selectively to $SiO_2$, until the second layer S2 is removed at unprotected locations. By this means, a second layer structure St2 and a third layer structure St3 arise from the provisional second layer structure and from the provisional third layer structure (see FIG. 2, FIG. 3 and FIG. 9). The second mask M2 is expanded beyond the first region B1 so as to be partially laterally adjacent to the first layer S1, due to which a step Stu is fashioned from the first layer S1 and from the second layer S2 (see FIG. 9). The second mask M2 is expanded beyond the second region B2. The parts of the second layer S2 that are protected by the second mask M2 and are located outside the first region B1 and the second region B2 serve as electrical connections.

By means of implantation, the doping material concentration of the third layer S3 in the second layer structure St2 and in the third layer structure St3 is increased to approx. $10^{21}$ $cm^{-3}$. For this purpose, the second mask M2 is retained. The second mask M2 is subsequently removed by etching with e.g. HF.

Figure 4:
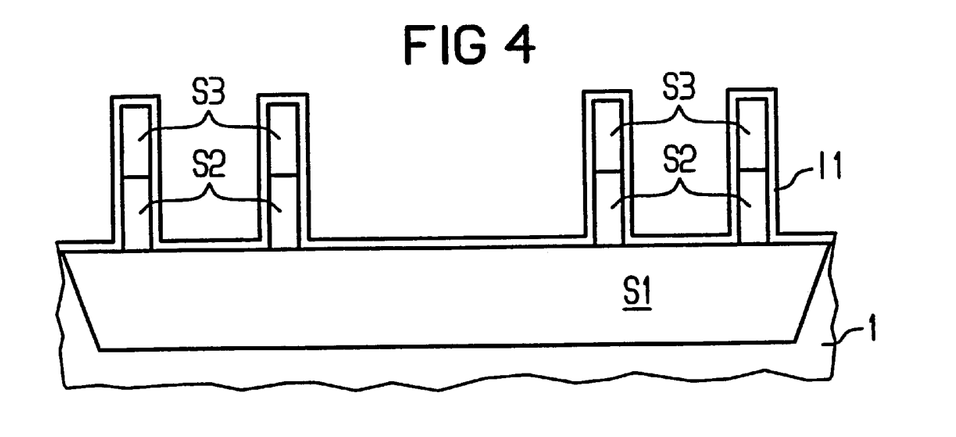
FIG. 4 shows a cross-section, parallel to the cross-section of FIG. 2 and FIG. 3, through the substrate, after production of a first insulating structure and of a second insulating structure.
Figure 5:
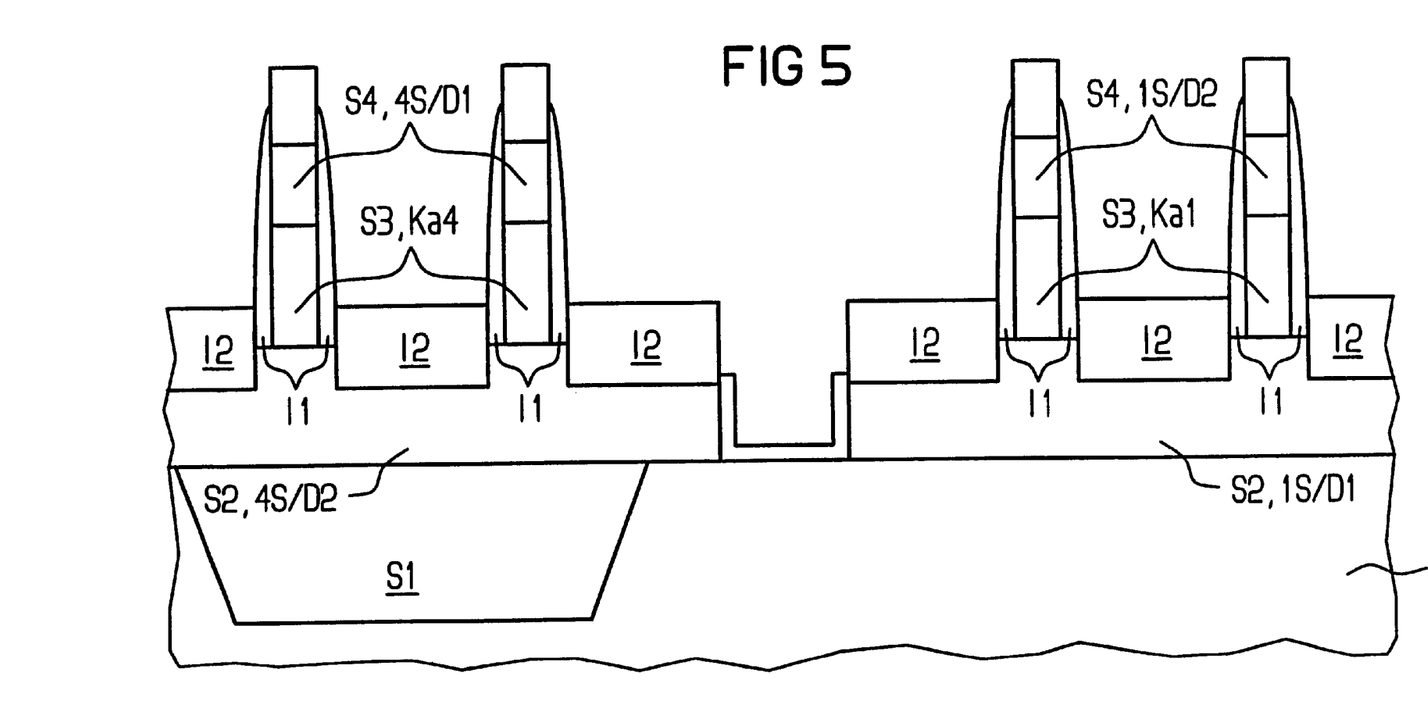
FIG. 5 shows the cross-section from FIG. 2 after the process steps from FIG. 4.
Figure 10:
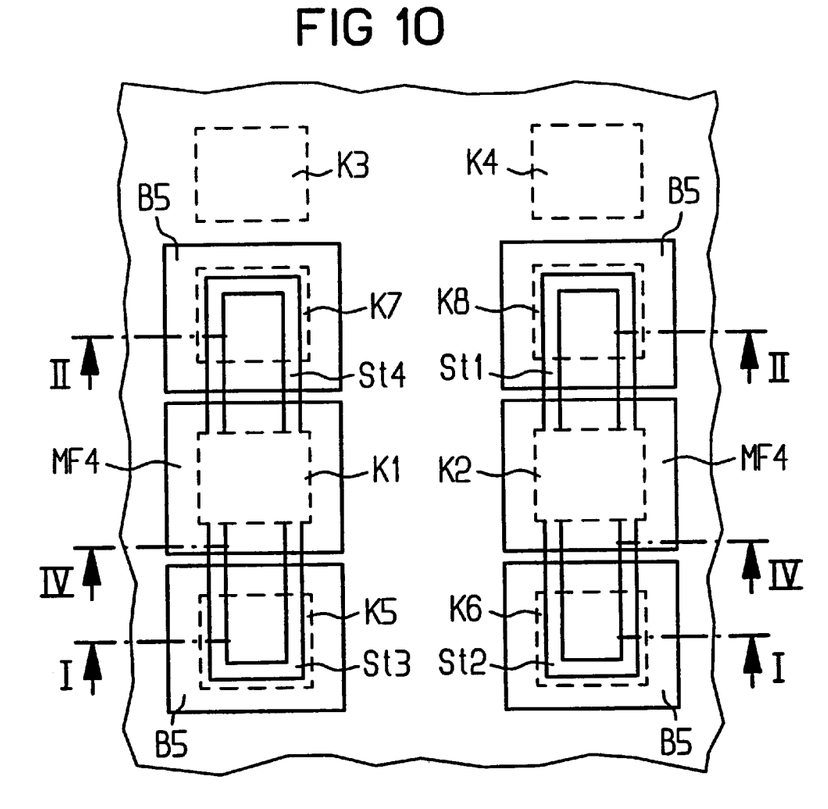
FIG. 10 shows a segment from a top view of the substrate, in which the layer structures, the contacts, the fifth regions and the fourth photoresist mask are shown.
Figure 11:
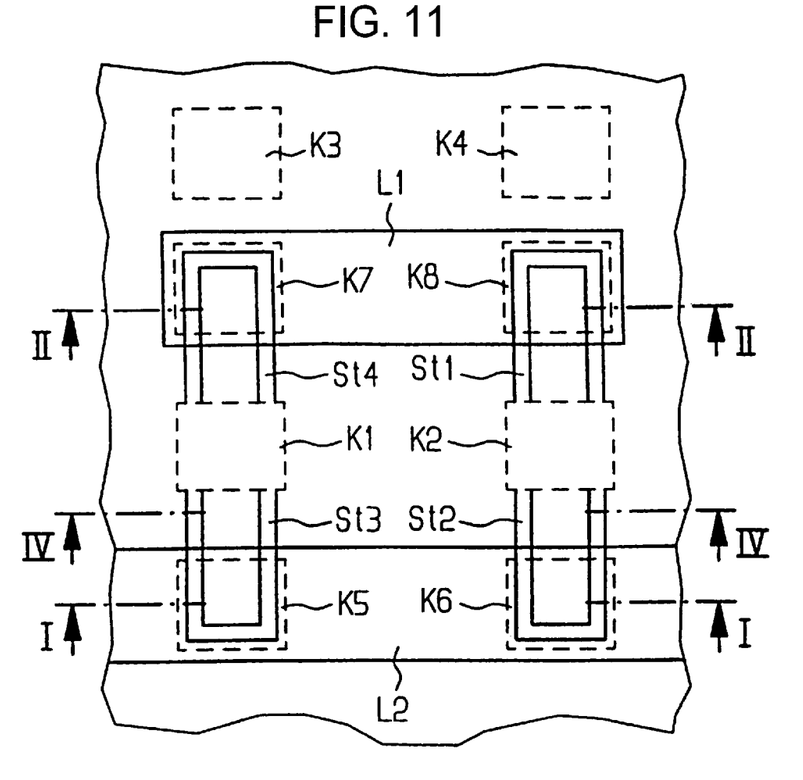
FIG. 11 shows a segment from a top view of the substrate, in which are shown the layer structures, the contacts, the first conductive structure and the second conductive structure.

Silicon nitride is subsequently deposited in a thickness of approx. 80 nm (see FIG. 4). By means of deposition and structuring of $SiO_2$, a third mask (not shown) is produced that does not cover fifth regions B5, in which the first transistor, the second transistor, the third transistor and the fourth transistor are produced (see FIG. 10). Subsequently, silicon nitride is etched selectively to $SiO_2$ and silicon, with e.g. $CF_4$/$CHF_3$/He, whereby a first insulating structure I1 is formed, which is spacer-shaped in the fifth regions B5 and is conformal outside the fifth regions B5 (see FIG. 4 and FIG. 5). Subsequently, a second insulating structure I2 is formed by means of thermal oxidation with a low temperature budget, at a temperature of approx. 600° C. and a pressure of approx. $10^6$ Pa (see FIG. 5). Subsequently, silicon nitride is wet-etched with e.g. $H_3PO$, and the third mask is removed by means of wet-etching with e.g. HF. By means of thermal oxidation, a gate dielectric Gd is grown. The gate dielectric Gd arises at locations at which parts of the first insulating structure I1 were located inside the fifth regions B5.

Subsequently, in-situ doped polysilicon is deposited. Using a fourth photoresist mask MF4, which essentially covers the third region B3 and the fourth region B4 (see FIG. 10), polysilicon is etched with e.g. $Cl_2$/$CHF_3$, whereby a spacer-type first gate electrode Ga1 arises on opposed edges of the first layer structure St1, a spacer-type second gate electrode Ga2 arises on opposed edges of the second layer structure St2, a spacer-type third gate electrode Ga3 arises on opposed edges of the third layer structure St3, and a spacer-type fourth gate electrode Ga4 arises on opposed edges of the fourth layer structure St4. Polysilicon under the fourth photoresist mask MF4 serves as a first contact surface connecting the third gate electrode Ga3 with the fourth gate electrode Ga4, and as a second contact surface connecting the first gate electrode Ga1 with the second gate electrode Ga2. On the first contact surface, a first contact K1 is later produced, and on the second contact surface a second contact K2 is later produced.

The second insulating structure I2 reduces capacitances formed by the first gate electrode Ga1 and the second layer S2, by the second gate electrode Ga2 and the first layer S1, by the third gate electrode Ga3 and the first layer S1, and by the fourth gate electrode Ga4 and the second layer S2.

Figure 6:
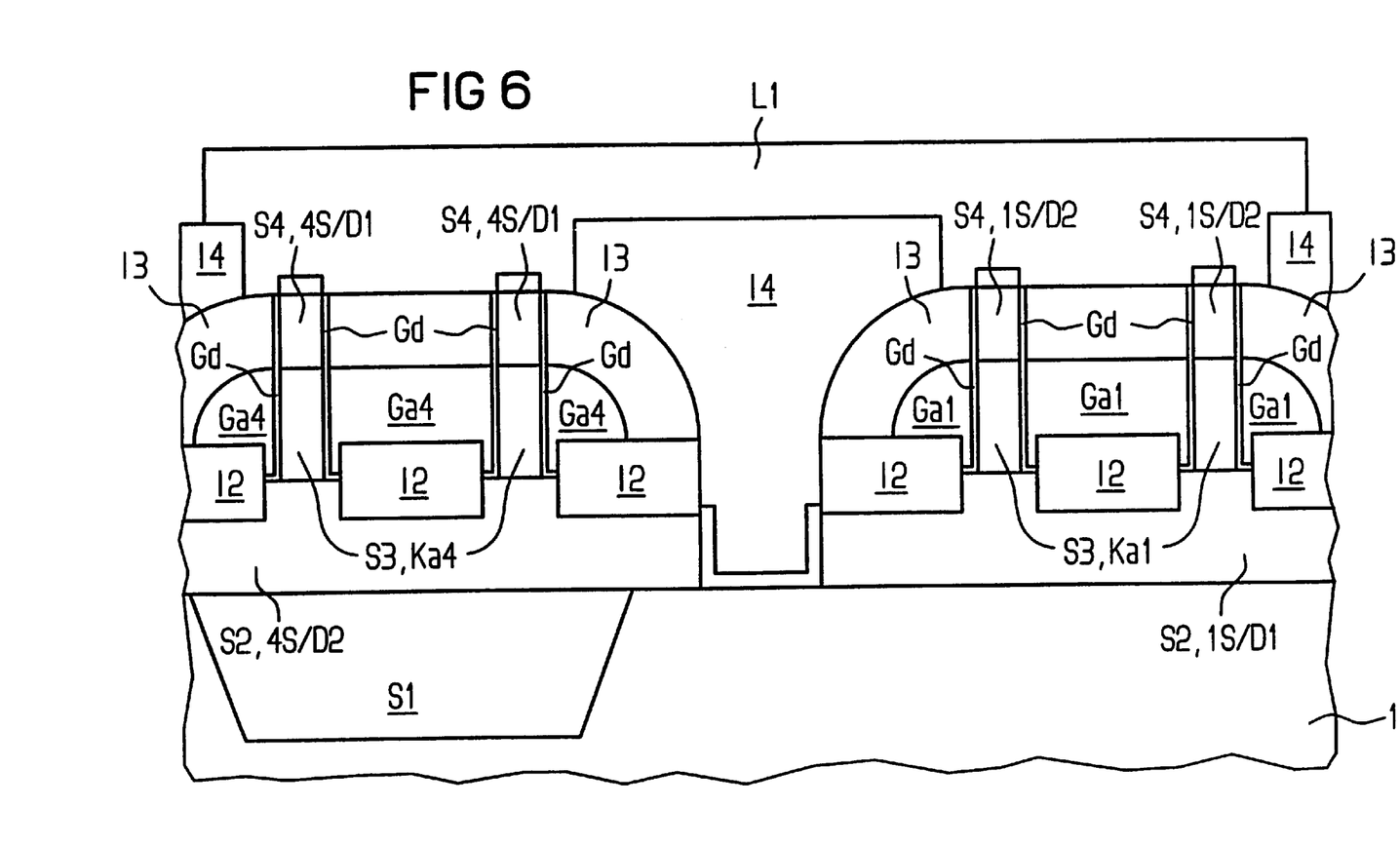
FIG. 6 shows the cross-section from FIG. 5 after partial removal of the first insulating structure and production of: a gate dielectric, a first gate electrode, a second gate electrode (not shown), a third gate electrode (not shown), a fourth gate electrode, a third insulating structure, a fourth insulating structure, a first contact, a second contact, a third contact, a fourth contact, a fifth contact, a sixth contact, a seventh contact, an eighth contact, a first conductive structure and a second conductive structure (not shown). The contacts are not all shown in this figure.
Figure 7:
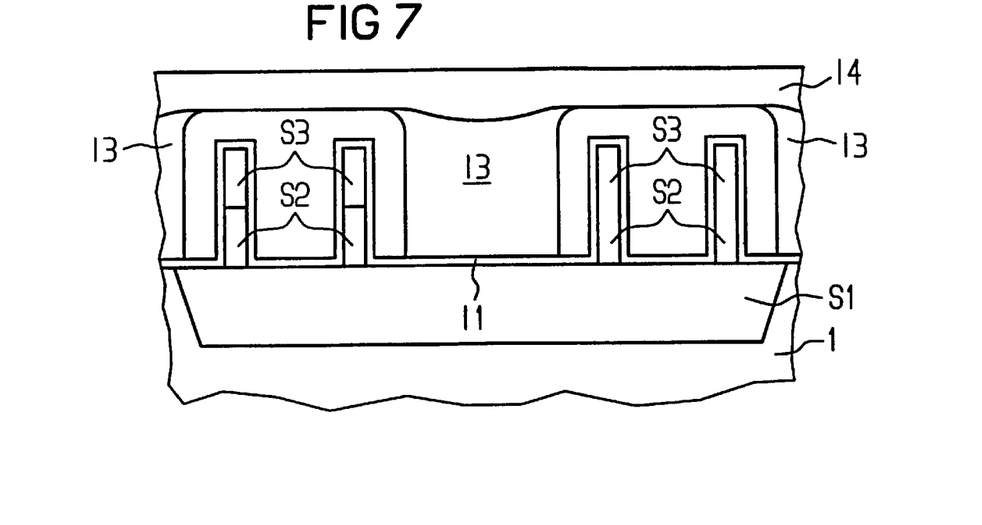
FIG. 7 shows the cross-section from FIG. 4 according to the process steps from FIG. 6.

The dimensions of the first region B1 and of the second region B2 are selected so that polysilicon essentially covers them after the etching of these regions (see FIG. 6).

Subsequently, $SiO_2$ is back-etched in a thickness of approx. 300 nm and with e.g. $Cl_2$/$CHF_3$, whereby a third insulating structure I3 is produced that covers the first gate electrode Ga1, the second gate electrode Ga2, the third gate electrode Ga3 and the fourth gate electrode Ga4. Subsequently, silicon nitride is deposited in a thickness of approx. 200 nm. Using a fifth photoresist mask (not shown), recesses are produced for contacts. Silicon nitride is thereby etched selectively to $SiO_2$ with e.g. $CF_4$/$CHF_3$/$H_2$. The third insulating structure I3, made of $SiO_2$, serves as an etch stop. For the first contact K1, a recess up to the first contact surface is produced. For the second contact K2, a recess up to the second contact surface is produced. For a third of the contacts K3, a recess is produced that overlaps the step Stu. For a fourth of the contacts K4, in a location originally covered by the second mask M2 a recess up to a part of the second layer S2, which part serves as an electrical connection to the first source/drain region of the first transistor, is produced. For a fifth of the contacts K5, a recess up to the first source/drain region of the third transistor is produced. For a sixth of the contacts K6, a recess is produced up to the first source/drain region of the second transistor. For a seventh of the contacts K7, a recess is produced up to the first source/drain region of the fourth transistor. For an eighth of the contacts K8, a recess is produced up to the second source/drain region of the first transistor.

Titanium is deposited in a thickness of approx. 100 nm and is selectively siliconized, whereby contact structures Ks arise. Residual titanium is removed with e.g. $CCl_2F_2$/$NF_3$.

Aluminum is deposited in a thickness of approx. 400 nm, whereby the contacts K1, K2, K3, K4, K5, K6, K7, K8 arise. Subsequently, the aluminum is structured in such a way that a first conductive structure L1 is produced that connects the seventh contact K7 and the eighth contact K8 with one another, and a second conductive structure L2 is produced that connects the fifth contact K5 and the sixth contact K6 with one another (see FIG. 6). The contact structures Ks reduce the electrical resistances of the contacts K1, K2, K3, K4, K5, K6, K7, K8.

Figure 12:
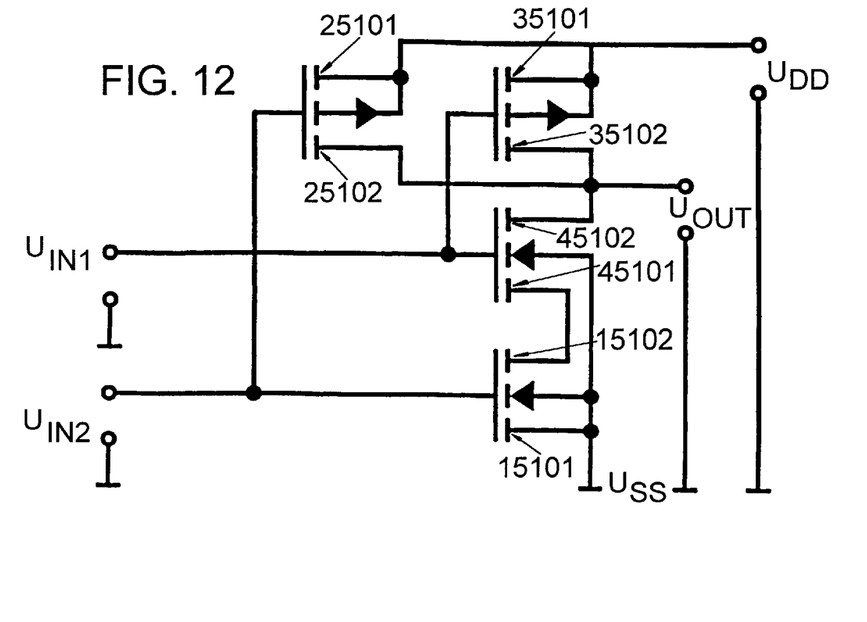
FIG. 12 shows a switching diagram of a NAND gate.

The four transistors form a NAND gate (see FIG. 12). The first contact K1 is connected with a first input voltage terminal $U_{IN1}$. The second contact K2 is connected with a second input voltage terminal $U_{IN2}$. The third contact K3 is connected with an output voltage terminal $U_{OUT}$. The fourth contact K4 is connected with a first voltage terminal $U_{SS}$. The second conductive structure L2 is connected with a second voltage terminal $U_{DD}$.

Many variations of the embodiment are conceivable that likewise fall within the scope of the invention. In particular, the dimensions of the specified layers, zones, regions and structures can be adapted to the respective requirements. The same holds for the proposed doping material concentrations. The second insulating structure can also be produced by means of a deposition method.

Insulating structures can also be produced from other insulating materials. In place of doped polysilicon, it is also possible to use e.g. metal silicides and/or metals.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A circuit arrangement comprising:

at least first, second, third and fourth transistors;

each of the transistors being a vertical MOS transistors;

the first transistor and the fourth transistor being complementary to the second transistor and to the third transistor;

the first transistor and the fourth transistor connected in series and between a first voltage terminal and an output voltage terminal;

the second transistor and the third transistor connected in parallel and between the output voltage terminal and a second voltage terminal;

a gate electrode of the third transistor and a gate electrode of the fourth transistor connected with a first input voltage terminal;

a gate electrode of the first transistor and a gate electrode of the second transistor connected with a second input voltage terminal;

at least first, second, third and fourth layer structures, the layer structures having channel layers of the transistors and at least one source/drain region of each transistor;

the layer structures having edges to which the channel layers are adjacent, and that are provided, at least in a region of the channel layers, with a gate dielectric to which the gate electrodes of the transistors are adjacent;

the channel layer of the first transistor and the channel layer of the fourth transistor being located at a common level;

the channel layer of the second transistor and the channel layer of the third transistor being located at a common level;

the channel layer of the first transistor and the channel layer of the second transistor being located at different levels.

2. The circuit arrangement according to claim 1, wherein a first source/drain region of the second transistor is arranged above the channel layer of the second transistor;

wherein a first source/drain region of the third transistor is arranged above the channel layer of the third transistor;

wherein a first source/drain region of the fourth transistor is arranged above the channel layer of the fourth transistor;

wherein a second source/drain region of the first transistor is arranged above the channel layer of the first transistor;

wherein the second source/drain region of the first transistor is connected to the first source/drain region of the fourth transistor via a first conductive structure;

wherein the first source/drain region of the second transistor is connected via a second conductive structure to the first source/drain region of the third transistor and to the second voltage terminal; and wherein a second source/drain region of the second transistor and a second source/drain region of the third transistor merge into one another.

3. The circuit arrangement according to claim 2, wherein the second source/drain region of the third transistor and a second source/drain region of the fourth transistor extend beyond the third transistor and the fourth transistor, and form a step; and wherein a contact of the output voltage terminal is arranged on the step.

4. The circuit arrangement according to claim 1, wherein a connection line that connects the first transistor with the second transistor, the second transistor with the third transistor, the third transistor with the fourth transistor, and the fourth transistor with the first transistor is one of a substantially tetragonal line or a straight line.

5. The circuit arrangement according to claim 4, wherein the second source/drain region of the third transistor and a second source/drain region of the fourth transistor extend beyond the third transistor and the fourth transistor, and form a step; and wherein a contact of the output voltage terminal is arranged on the step.

6. The circuit arrangement according to claim 1, wherein a contact of the first input voltage terminal is arranged between the third transistor and the fourth transistor; and wherein a contact of the second input voltage terminal is arranged between the first transistor and the second transistor.

7. A method for manufacturing a circuit arrangement with at least four transistors, comprising the steps of:

producing a layer sequence that has at least one first layer doped with a first conductivity type, a second layer, arranged thereabove, doped with a second conductivity type opposed to the first conductivity type, a third layer, arranged thereabove, doped with the first conductivity type, and a fourth layer, arranged thereabove, doped with the second conductivity type;

structuring the layer sequence for producing two first layer structures by etching at least into the third layer;

structuring the layer sequence for producing two second layer structures by etching at least into the second layer;

providing edges of the two first layer structures with gate dielectric at least in a region of the third layer, and producing gate electrodes adjacent thereto;

providing edges of the two second layer structures with gate dielectric at least in a region of the second layer, and producing gate electrodes adjacent thereto;

connecting parts of the first, second, third and fourth layers and the respective gate electrodes such that a circuit arrangement is produced in which the first and second layer structures are parts of vertical transistors, and a first transistor and a fourth transistor are connected in series and between a first voltage terminal and an output voltage terminal, and a second transistor and a third transistor are connected in parallel and between the output voltage terminal and a second voltage terminal, and two of the gate electrodes, of which one is allocated to the third transistor and one is allocated to the fourth transistor, are connected to a first input voltage terminal, and two other of the gate electrodes, of which one is allocated to the first transistor and one is allocated to the second transistor, are connected with a second input voltage terminal.

8. The method according to claim 7, wherein the first and second layer structures are structured by an etching process in which spacers serve as a first mask.

9. The method according to claim 8, wherein, for producing the spacers, a first auxiliary layer is produced that is structured such that edges form, and wherein, after producing the structured first auxiliary layer, a second auxiliary layer is produced and is back-etched, so that the spacers are formed from the second auxiliary layer, adjacent to the edges of the first auxiliary layer.

10. The method according to claim 8, wherein a first spacer of the spacers is produced along edges of a rectangular first region;

wherein a second spacer of the spacers is produced along edges of a rectangular second region;

wherein a part of the first spacer is subsequently removed in a third region that transversely overlaps the first region;

wherein, in a fourth region, which transversely overlaps the second region, a part of the second spacer is removed;

wherein the structured auxiliary layer is subsequently removed;

wherein parts of at least two layers of the layer sequence are subsequently removed by etching, whereby the first spacer and the second spacer act as the first mask;

wherein the first spacer and the second spacer are subsequently removed;

wherein, using a second mask that overlaps a first half of the first region, and covers a first half of the second region, a part of a layer of the layer sequence is subsequently removed, whereby the first layer and the second layer outside the first region and the second region form a step;

wherein a first insulating layer is produced that covers at least a region in which the first region overlaps with the third region, and a region in which the second region and the fourth region overlap;

wherein material is deposited and etched using a fourth mask that covers at least the region wherein the first region overlaps with the third region, and the region wherein the second region overlaps with the fourth region, whereby the gate electrodes and two contact surfaces are produced; and wherein a contact of the output voltage terminal is structured such that the contact of the output voltage terminal overlaps the step.

11. A circuit arrangement comprising:

at least first, second, third and fourth transistors;

each of the transistors being a vertical MOS transistors;

the first transistor and the fourth transistor being complementary to the second transistor and to the third transistor;

the first transistor and the fourth transistor connected in series and between a first voltage terminal and an output voltage terminal;

the second transistor and the third transistor connected in parallel and between the output voltage terminal and a second voltage terminal;

a gate electrode of the third transistor and a gate electrode of the fourth transistor connected with a first input voltage terminal;

a gate electrode of the first transistor and a gate electrode of the second transistor connected with a second input voltage terminal;

at least first, second, third and fourth layer structures, the layer structures having channel layers of the transistors and at least one source/drain region of each transistor;

the layer structures having edges to which the channel layers are adjacent, and that are provided, at least in a region of the channel layers, with a gate dielectric to which the gate electrodes of the transistors are adjacent;

the channel layer of the first transistor and the channel layer of the fourth transistor being located at a common level;

the channel layer of the second transistor and the channel layer of the third transistor being located at a common level;

the channel layer of the first transistor and the channel layer of the second transistor being located at different levels;

a first source/drain region of the second transistor arranged above the channel layer of the second transistor;

a first source/drain region of the third transistor arranged above the channel layer of the third transistor;

a first source/drain region of the fourth transistor arranged above the channel layer of the fourth transistor;

a second source/drain region of the first transistor arranged above the channel layer of the first transistor;

the second source/drain region of the first transistor connected to the first source/drain region of the fourth transistor via a first conductive structure;

the first source/drain region of the second transistor connected via a second conductive structure to the first source/drain region of the third transistor and to the second voltage terminal; and a second source/drain region of the second transistor and a second source/drain region of the third transistor merged into one another.

12. The circuit arrangement according to claim 11, wherein the second source/drain region of the third transistor and a second source/drain region of the fourth transistor extend beyond the third transistor and the fourth transistor, and form a step; and wherein a contact of the output voltage terminal is arranged on the step.

13. The circuit arrangement according to claim 11, wherein a connection line that connects the first transistor with the second transistor, the second transistor with the third transistor, the third transistor with the fourth transistor, and the fourth transistor with the first transistor is one of a substantially tetragonal line or a straight line.

14. The circuit arrangement according to claim 13, wherein the second source/drain region of the third transistor and a second source/drain region of the fourth transistor extend beyond the third transistor and the fourth transistor, and form a step; and wherein a contact of the output voltage terminal is arranged on the step.

15. The circuit arrangement according to claim 11, wherein a contact of the first input voltage terminal is arranged between the third transistor and the fourth transistor; and wherein a contact of the second input voltage terminal is arranged between the first transistor and the second transistor.

* * * * *